United States Patent [19]

Pansaerts et al.

[11] Patent Number: 4,547,835
[45] Date of Patent: Oct. 15, 1985

[54] MECHANICAL LOCKING DEVICE FOR ELECTRICAL EQUIPMENT

[75] Inventors: Marcel F. R. Pansaerts, Antwerp; Joseph M. F. Bogaert, Wilrijk; Etienne K. A. Decolvenaer, St. Katelijne-Waver, all of Belgium

[73] Assignee: International Standard Electric Corporation, New York, N.Y.

[21] Appl. No.: 477,574

[22] Filed: Mar. 21, 1983

[51] Int. Cl.[4] .............................................. H05K 1/18
[52] U.S. Cl. .................................... 361/399; 361/415
[58] Field of Search ............... 361/415, 384, 393, 394, 361/399; 70/224, DIG. 31; 339/17 M, 17 CR

[56] References Cited

U.S. PATENT DOCUMENTS

| 3,348,148 | 10/1967 | Parsons et al. | 361/389 X |
|---|---|---|---|
| 3,467,891 | 9/1969 | Mogle | 339/17 M X |
| 3,603,845 | 9/1971 | Beers | 361/399 X |
| 3,636,413 | 1/1972 | Ditthardt et al. | 361/399 X |
| 3,664,510 | 5/1972 | Kerschbaum | 211/41 |
| 3,691,430 | 9/1972 | Freitag | 211/41 X |
| 3,733,523 | 5/1973 | Reynolds et al. | 211/41 X |
| 3,950,057 | 4/1976 | Calabro | 211/41 X |
| 4,002,953 | 1/1977 | Tetlie | 211/41 X |
| 4,007,403 | 2/1977 | Fiege | 211/41 X |
| 4,013,928 | 3/1977 | Sarinopoulos | 211/41 X |
| 4,019,099 | 4/1977 | Calabro | 211/41 X |
| 4,022,326 | 5/1977 | Marconi | 211/41 |
| 4,075,683 | 2/1978 | Johansson | 211/41 X |
| 4,092,699 | 5/1978 | Petrangelo | 211/41 X |
| 4,096,548 | 6/1978 | Misono et al. | 361/399 |
| 4,157,583 | 7/1979 | Basmajian et al. | 361/399 X |
| 4,334,261 | 6/1982 | Gonzales | 361/415 X |
| 4,414,605 | 11/1983 | Chino et al. | 361/415 X |
| 4,420,794 | 12/1983 | Anderson | 361/380 X |

FOREIGN PATENT DOCUMENTS 3146904 1/1983 Fed. Rep. of Germany ...... 361/422

Primary Examiner—R. R. Kucia
Attorney, Agent, or Firm—John T. O'Halloran; Jeffrey P. Morris

[57] ABSTRACT

A mechanical locking device including a rotatable stem-shaped locking member for latching together a first part having a locking opening therein and a second part, by cooperation of the locking member with the opening during a rotation of the locking member, the locking member being shaped so as to be able to be pushed axially through a resilient locking hole in the second part and so as to be thereafter unable to move axially either in a forward or rearward direction, in which the first part is a rack for mounting electrical equipment is described.

6 Claims, 13 Drawing Figures

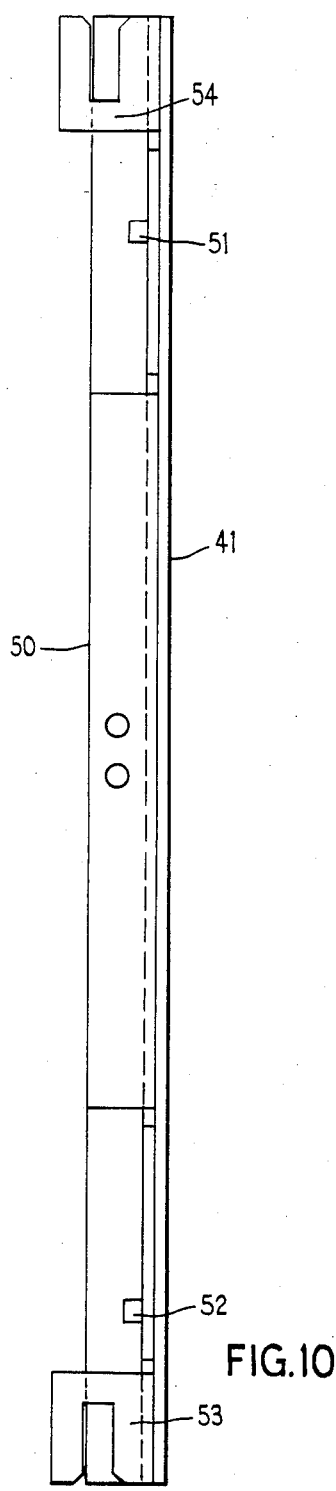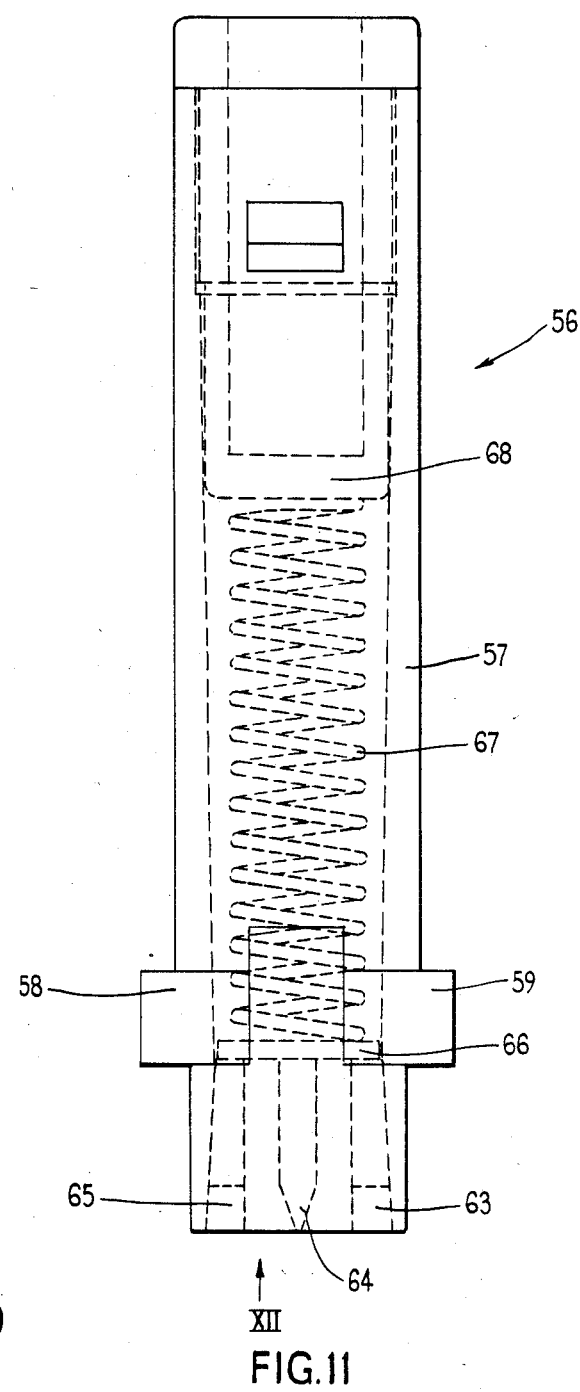
FIG.10
FIG.11

MECHANICAL LOCKING DEVICE FOR ELECTRICAL EQUIPMENT

BACKGROUND OF THE INVENTION

The present invention relates to a mechanical locking device including a rotatable stem-shaped locking member for latching together a first part having a locking opening therein and a second part, by cooperation of said locking member with said opening during a rotation of said locking member.

Such a device is already known from page 40 of "Machine Design", Sept. 25, 1980. Therein the locking member is a partly cylindrical rod having a rounded part and a flat part; the first part is a rack for mounting electrical equipment and provided with a longitudinal U-shaped guiding channel laterally delimited by a fixed flange and a flexible lip, and with a cylindrical locking channel extending along the flexible lip; the second part is a printed circuit board with an edge slidably mounted in the guiding channel; and the rod is housed in the locking channel. When its flat part faces the flexible lip, the rod can be easily inserted in the locking channel and when it is then turned until its flat part is substantially perpendicular to the flexible lip the latter is pushed into the direction of the fixed flange so as to lock the printed circuit board.

An advantage of this known device is that the printed circuit board is locked by a simple rotation of the rod and without axial displacement thereof so that no axial forces are hereby exerted on the board. Such forces could be harmful for the printed circuit board and/or for the connectors by means of which the board is coupled to the rack electrical equipment. However, with this known device the locking channel and the rod extend over the whole length of the printed circuit board and it is essential to provide a flexible lip extending over this whole length.

SUMMARY OF THE INVENTION

An object of the present invention is to provide a mechanical locking device of the above type, but enabling latching of the second part without necessitating an action on the whole length thereof.

According to the invention this object is achieved due to the fact that said locking member is shaped so as to be able to be pushed axially through a resilient locking hole in said second part and so as to be thereafter unable to move axially either in a forward or rearward direction.

Another feature of the present mechanical locking device is that said first part is a rack for mounting electrical equipment and provided with said opening and with guiding means and that said second part comprises a printed circuit board with parallel edges slidably mounted in said guiding means and a supporting element which is integral with another edge of said board and is provided with said locking hole, said supporting element carrying said locking member.

Due to the locking member being now carried by a supporting element integral with the printed circuit board, it is possible to make it relatively short and since the locking member cannot axially be displaced with respect to the printed circuit board no axial forces can be exerted on this board and the associated connector through the supporting element when turning the locking member.

The above mentioned and other objects and features of the invention will become more apparent and the invention itself will be best understood by referring to the following description of a preferred embodiment taken in conjunction with the accompanying drawings in which:

BRIEF DESCRIPTION OF THE DRAWINGS

FIG. 10 is a side view in the direction of arrow X of the device of FIG. 9 after the stiffener member has been removed;

FIG. 11 is a top plan view of an unlocking tool according to the invention;

The mechanical locking device shown in FIGS. 1 to 8 is described in detail hereinafter.

Figure 1:
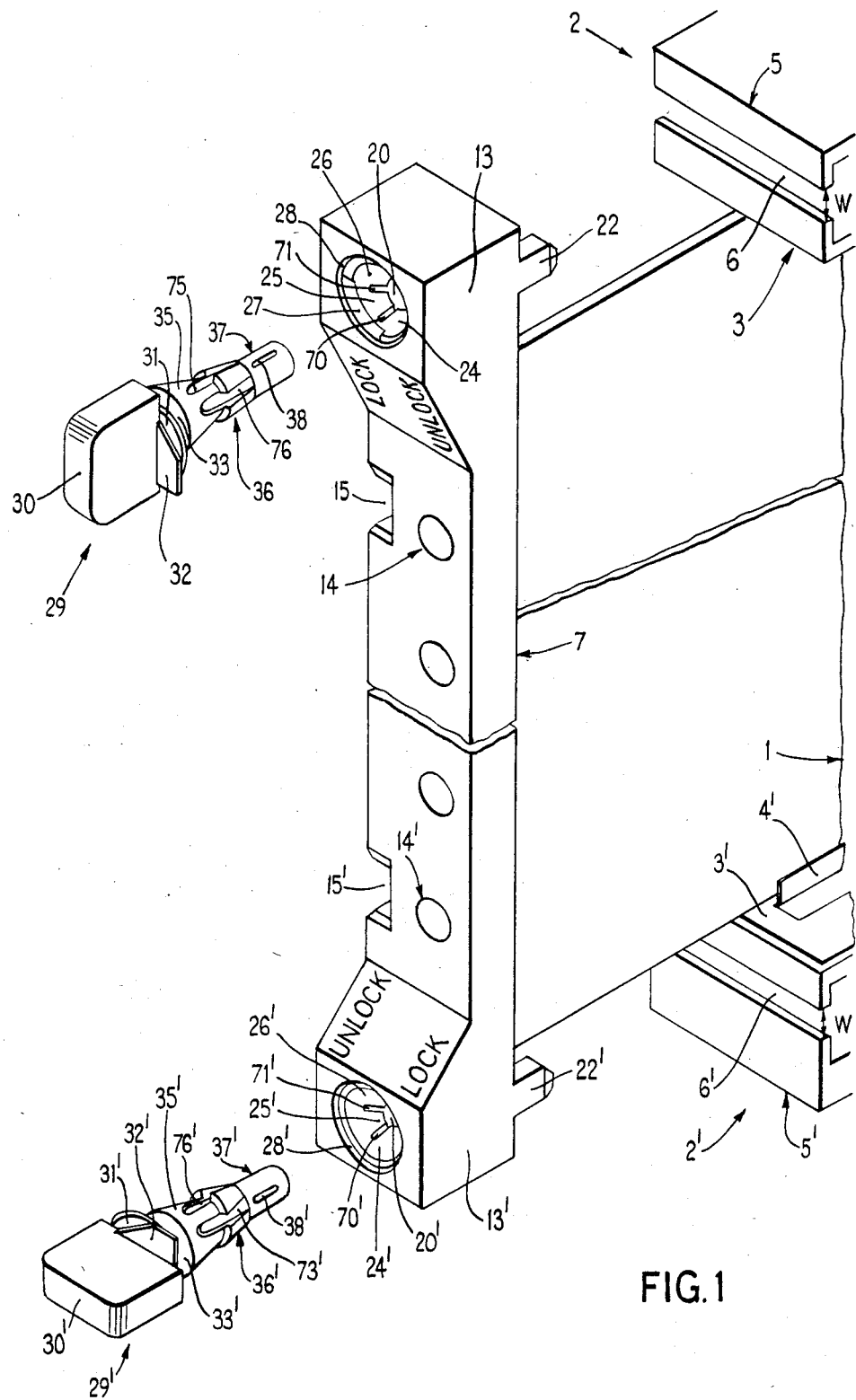
FIG. 1 is an exploded perspective view of a mechanical locking device according to the invention, with the central part of the device being broken away.

This device as shown in FIG. 1 enables a printed circuit board 1 which is slidably mounted in a subrack 2, 2', suitable for mounting electrical equipment, to be locked in this subrack or to be unlocked therefrom. The printed circuit board 1 is for instance provided with a male connector (not shown) to be inserted in the female connector (not shown) mounted at the back of the subrack 2, 2' which further includes two parallel horizontal mounting plates 3, 3' provided with a guide rail on their lower and upper face respectively, e.g. guide rail 4' on plate 3'. The subrack 2, 2' also includes two horizontal plates 5, 5' delimiting with the horizontal plates 3, 3' longitudinal locking and guiding slots 6, 6' having a width W.

Figure 2:
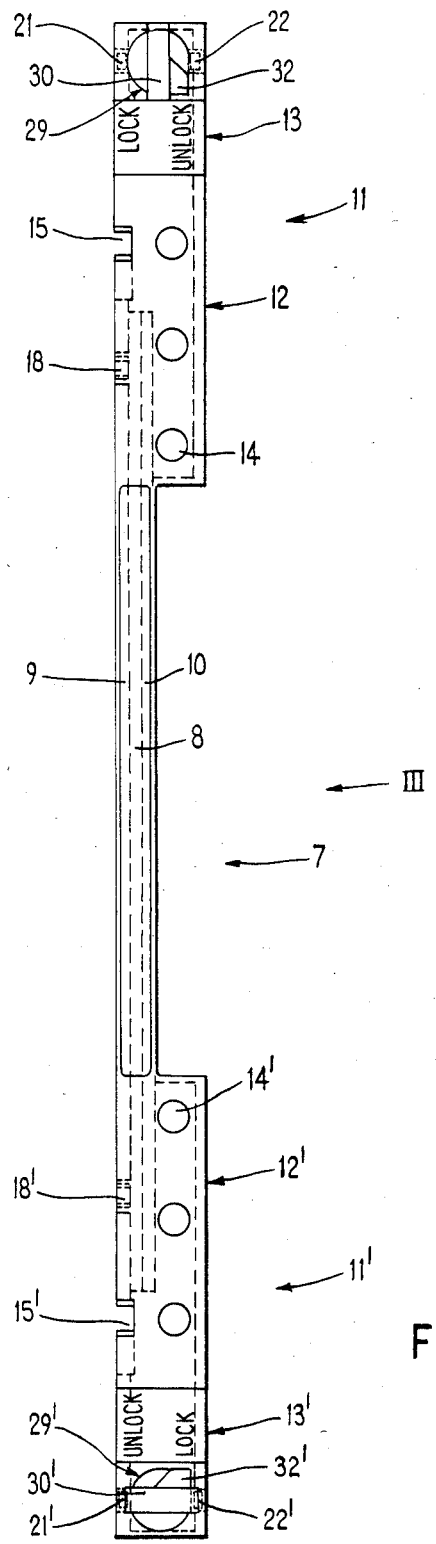
FIG. 2 is a front view of stiffener member 7 and locking pins 29, 29' of FIG. 1, these locking pins being fixed in the stiffener member 7.

A supporting element or stiffener member 7 as shown in FIG. 2 which is fixed to the vertical front edge of the printed circuit board 1 includes a longitudinal channel 8 delimited by parallel side walls 9 and 10 and integral with identical substantially hollow end parts 11, 11' having a side face which is flush with a face of side wall 9. End part 11, 11' has a body portion 12, 12' and a head portion 13, 13'. Body portion 12, 12' has a plurality of holes such as 14, 14' for mounting electrical equipment and a cut-out portion 15, 15' giving access to a recess 16, 16' in side wall 9. This recess 16, 16' is delimited at one side by the cut-out portion 15, 15' and a hooking lip 17, 17'. Body portion 13, 13' is also provided with a lug 18, 18' with holes 19, 19' through which the vertical front edge of the printed circuit board 1 located in channel 8 is riveted (not shown). Head portion 13, 13' is provided with a resilient hole 20, 20' in its front face and has two parallel lateral positioning studs 21, 22; 21', 22' the width of which is substantially equal to W. The axes of the studs 21, 22 and of the hole 20 are co-planar and the same is true for the elements 20' to 22'. Head portion 13, 13' also has an inclined face on which the words "LOCK" and "UNLOCK" are engraved. Hole 20, 20' in this head portion 13, 13' is mainly delimited by four resilient lips 23 to 26, 23' to 26' separated by slots 69–72 and constituting the split peripheral wall of a frusto-conical sleeve having an open top and an open bottom which widens into an annular recess, such as 27, extending over about 90° and into an annular recess 28, 28' extending over the remaining 270°, recess 27, 27' being deeper than recess 28, 28' note that each of the recesses such as 27 is located adjacent the word LOCK.

Figure 3:
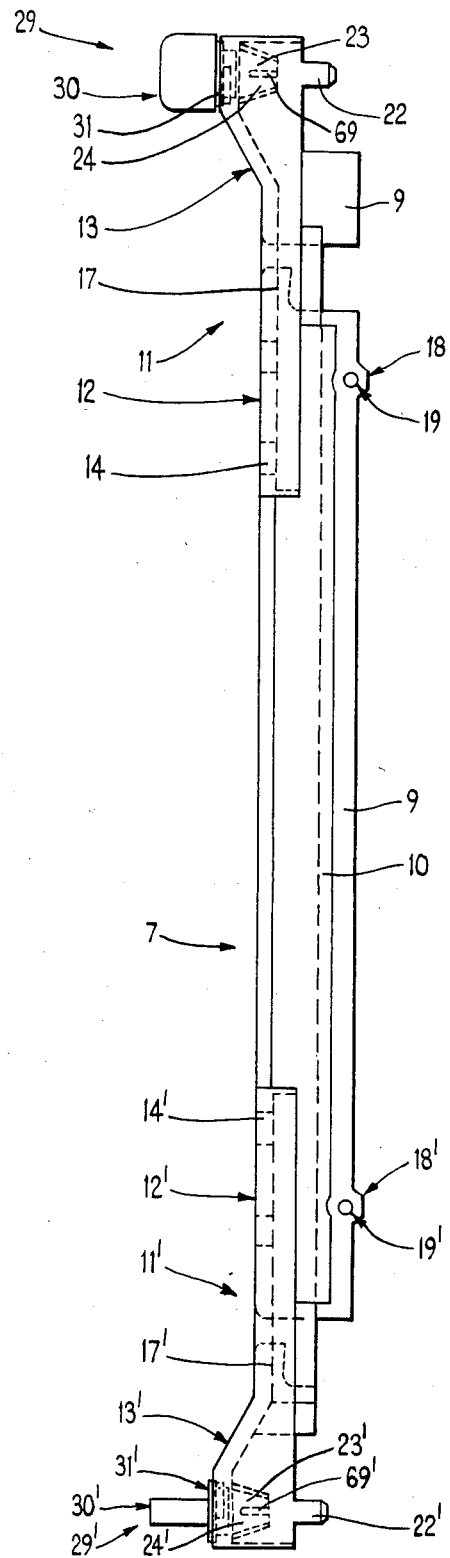
FIGS. 3 and 4 are side views of the stiffener member in the direction of arrow III of FIG. 2 and in the opposite direction respectively.
Figure 4:
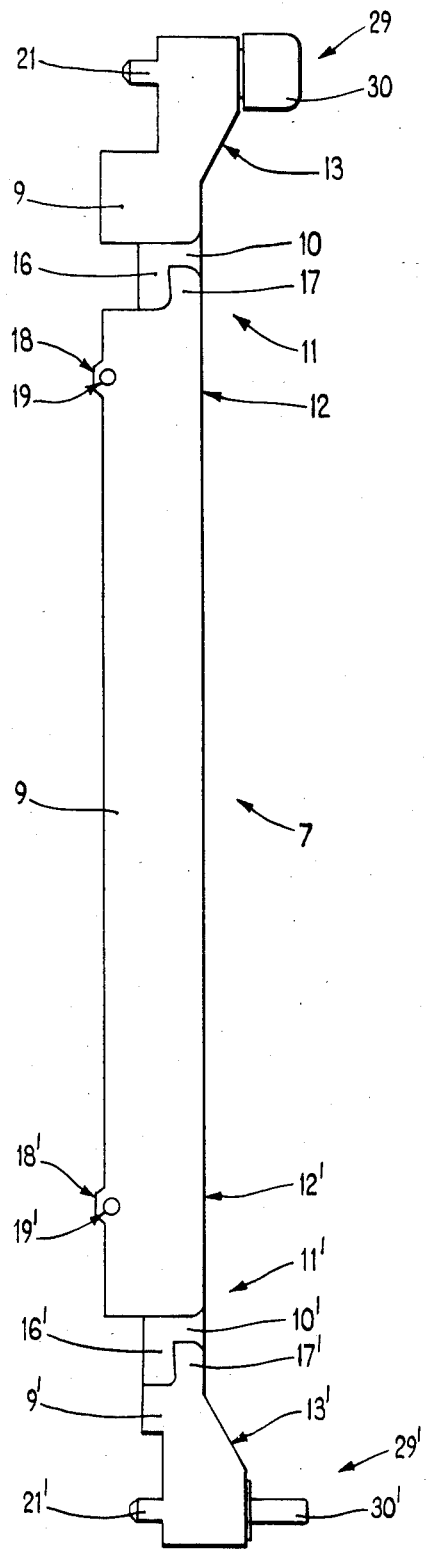

Stem-shaped locking pins 29, 29' as shown in FIGS. 3 and 4 are able to be inserted in the above holes 20, 20' and comprise a wing-shaped head 30, 30' to rotate the pin, an annular collar 31, 31' provided with a pointer 32, 32' for indicating the LOCK and UNLOCK positions of the pin, a cylindrical portion 33, 33' provided with an indexing finger 34, 34', a frusto-conical body 35, 35', a frusto-conical collar 36, 36' and an oval tail portion 37, 37' which is chamfered at its end, the latter collar and tail being provided with an axial slot 38, 38' to increase their resiliency.

The collar 36, 36' and part of the body 35, 35' are provided with four axially extending small guidance channels 73 to 76 which are at 90° from each other. Oval tail portion 37, 37' has a minimum width w smaller than W and a maximum width w' larger than W. Collar 31, 31' fits in annular recess 28, 28'; indexing finger 34, 34' fits in annular recess 27, 27'; and conical body 35, 35' fits in the split sleeve with lips 23–26, 23'–26'.

To associate the stem-shaped locking pin 29, 29' and the stiffener member 7 this pin is axially inserted in the hole 20, 20' of this member until the collar 31, 31' fits in the annular recess 28, 28' and the indexing finger 34, 34' is engaged in the annular recess 27, 27'. During this axial movement of the locking pin 29, 29' the resilient lips of the frusto-conical sleeve 23–26, 23'–26' are spread apart by the frusto-conical collar 36, 36' and at the end of this movement these lips snap behind the rear edge of the collar 36, 36'. Thus the axial movement of the locking pin 29, 29' is prevented in forward direction by the collar 31, 31' and in rearward direction by the collar 36, 36' and its angular movement is limited to about 90° due to indexing finger 34, 34' being engaged in the angular recess 27, 27' which extends over about 90°.

Figure 5:
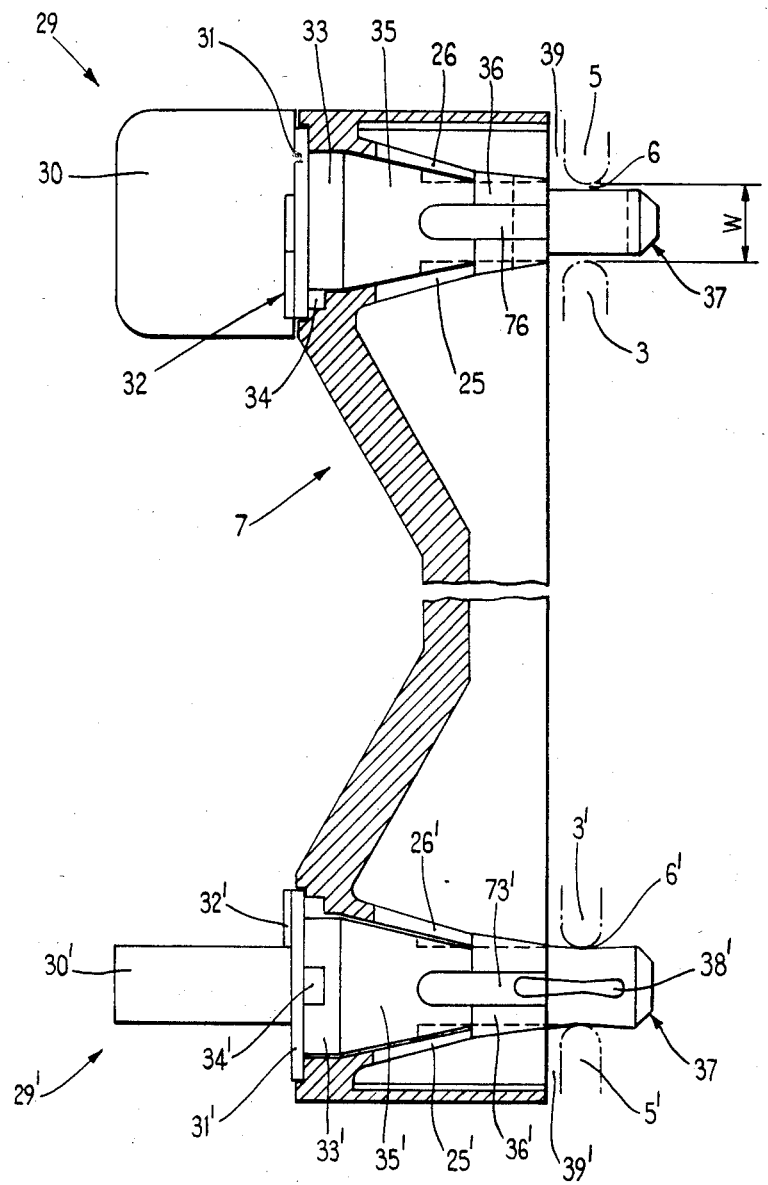
FIG. 5 is a longitudinal sectional view along a plane passing through the axes of locking pins 29, 29' fixed in stiffener member 7 and in subrack 2, 2' of FIG. 1, the locking pins being not represented in cross-section and the stiffener member being not shown in detail.
Figure 6:
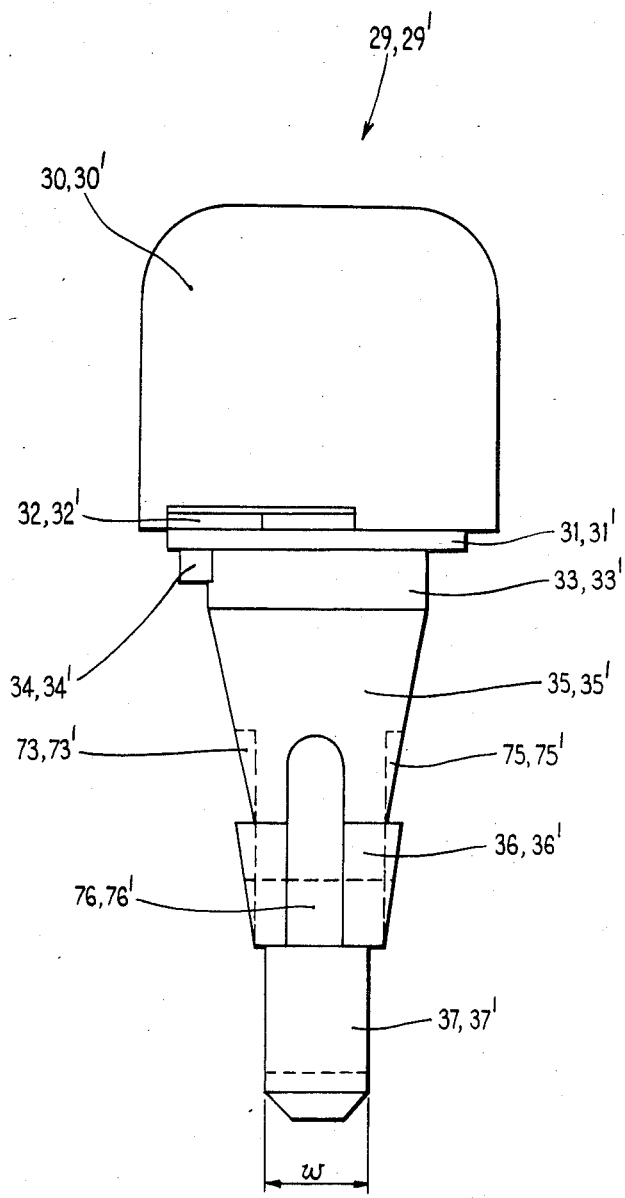
FIGS. 6, 7 and 8 are a front view, a side view, and a bottom view respectively of locking pins 29, 29' shown in FIG. 1.
Figure 7:
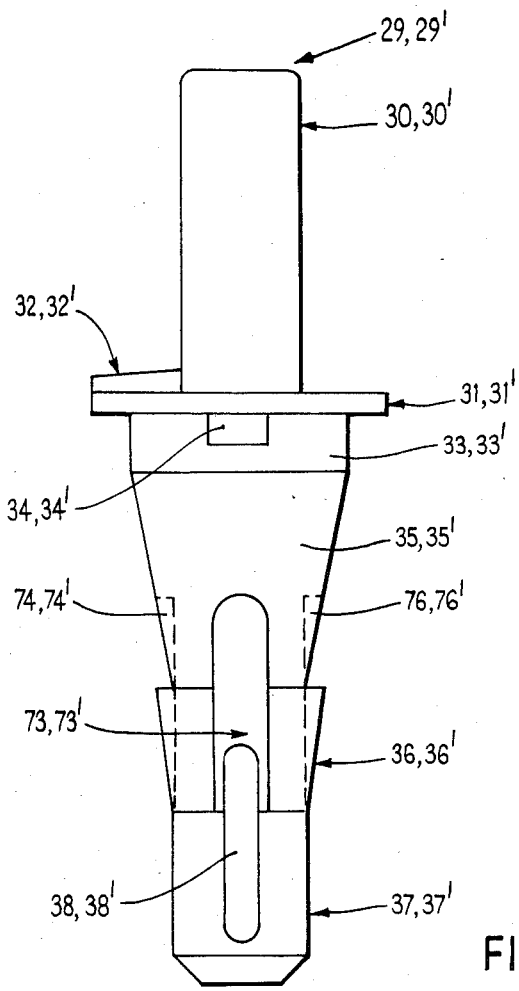
Figure 8:
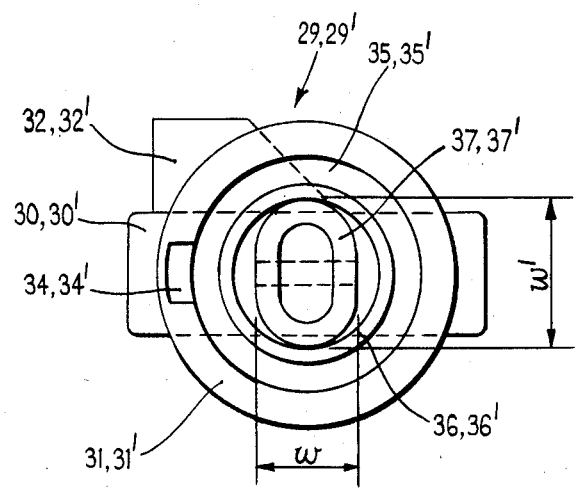

To lock the printed circuit board 1 in subrack 2, 2' each locking pin 29, 29' mounted in the stiffener member 7 thereof is first turned in the UNLOCK position, i.e. in the position of locking pin 29 in FIG. 5, so that its tail portion 37, 37' can be inserted in the guiding and locking slot 6, 6' of this subrack 2, 2'. At the end of this operation the stiffener member 7 is at some distance 39, 39' (FIG. 5) from the subrack 2, 2'. Each locking pin 29, 29' is then turned over an angle of about 90° into its LOCK position, i.e. in the position of locking pin 29' in FIG. 5. During this rotation the tail portion 37, 37' is compressed, its largest dimension w' being reduced to W. Such a compression is possible due to the presence of slots such as 38, 38'.

Figure 9:
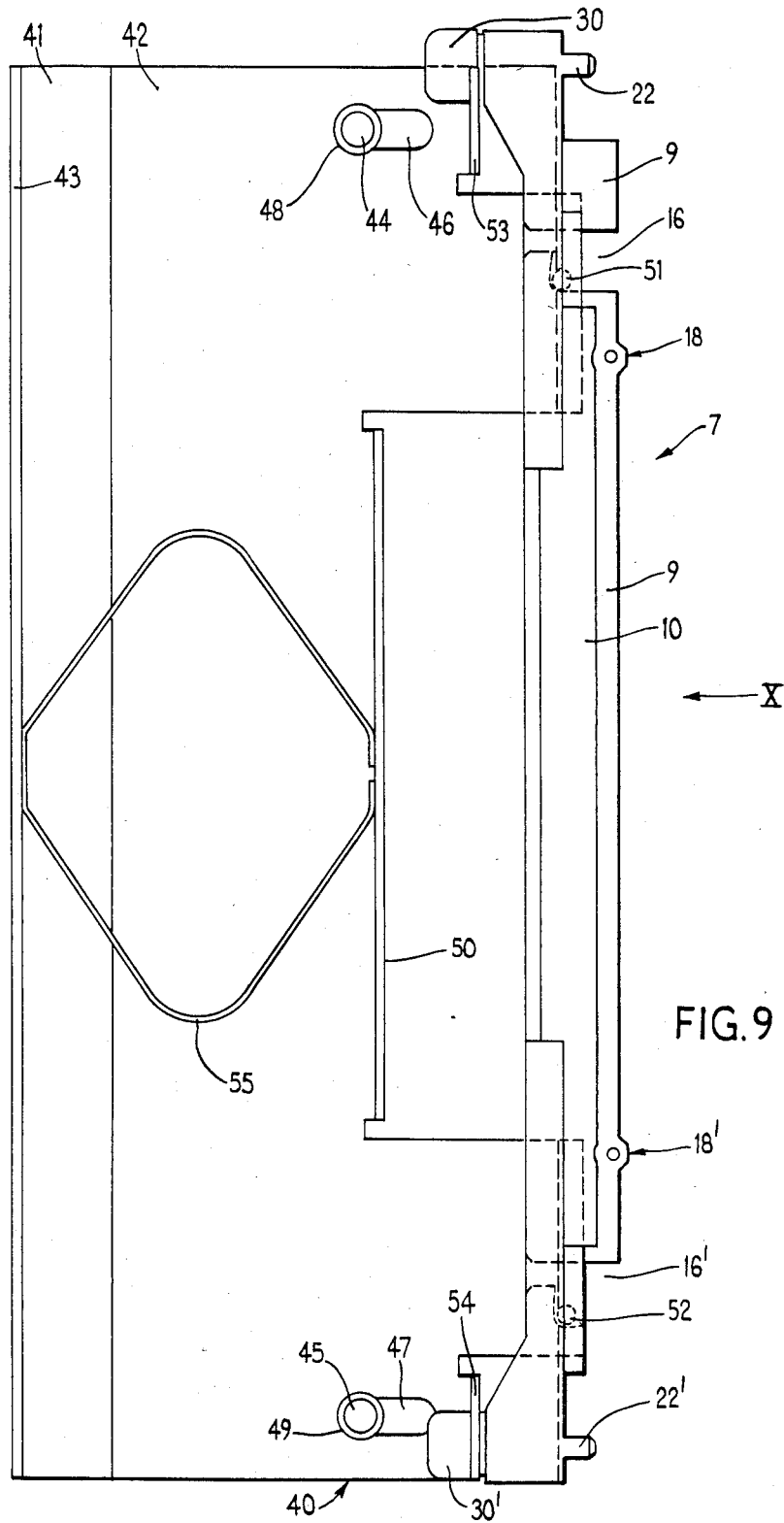
FIG. 9 is a front view of an extraction tool according to the invention attached to stiffener member 7 of FIG. 1.
Figure 12:
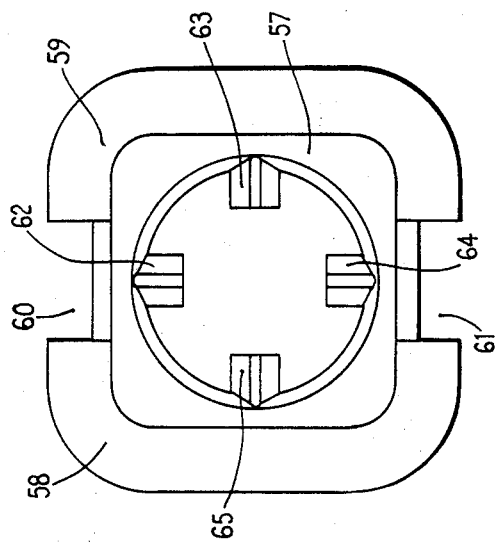
FIG. 12 is a side view in the direction of arrow XII of the unlocking tool of FIG. 11.

The extraction tool 40 shown in FIGS. 9 and 10 has the shape of a handle and includes two substantially U-shaped tool members or plates 41 and 42. U-shaped plate 41 has a longitudinal upstanding rim 43 and two upstanding guiding pins 44, 45 which protrude through longitudinal guiding slots 46, 47 of plate 42 which is prevented from being disconnected from plate 41 by washers 48, 49 secured to these guiding pins 44, 45. Plate 42 further has a longitudinal upstanding rim 50, two fixing pins 51, 52 and two U-shaped abutments 53, 54 the openings of which are directed away from the pins 51, 52. A spring member 55 is secured between the upstanding rims 43 and 50 of plates 41 and 42 respectively and urges these plates away from each other in the position shown in FIG. 9, plate 42 being thereby guided on plate 41 by the pins 44, 45 and slots 46, 47. The part of the extraction handle 40 located between the rims 50 and 43 can be easily taken in hand and plates 41, 42 can then be moved by the fingers against the action of spring 55.

To be able to extract the printed circuit board 1 which has been locked in the subrack 2, 2' in the manner described above, first both the locking pins 29, 29' are brought in their unlock position. The extraction handle 40 is then laterally attached to the stiffener member 7, integral with the printed circuit board 1, by forwardly sliding fixing pins 51, 52 of plate 42 of this handle 40 into the recesses 16, 16' through cut-out portions 15, 15'. This forward movement is possible due to the head 30, 30' of locking pins 29, 29' being able to pass through the openings in the U-shaped abutments 54, 53 and is limited by these abutments. The extraction handle 40 is then slid downwardly so as to engage fixing pins 51, 52 behind locking lips 17, 17' of stiffener member 7. This downward movement is limited by the lower edge of the recesses 16, 16'.

When the extraction handle 40 has thus been laterally attached to the stiffener member 7, its forward and backward movement is prevented by the lips 17, 17' and the abutments 54, 55 and its downward movement is inhibited by the lower edges of the recesses 16, 16'.

To extract the printed circuit board 1 from the subrack 2, 2' it is then sufficient to displace plate 42 with respect to fixed plate 41 against the action of spring 55. Indeed, from the moment the front edge of plate 41 bears on the front plane of subrack 2, 2' the board 1 is extracted from this subrack 2, 2'.

Figure 13:
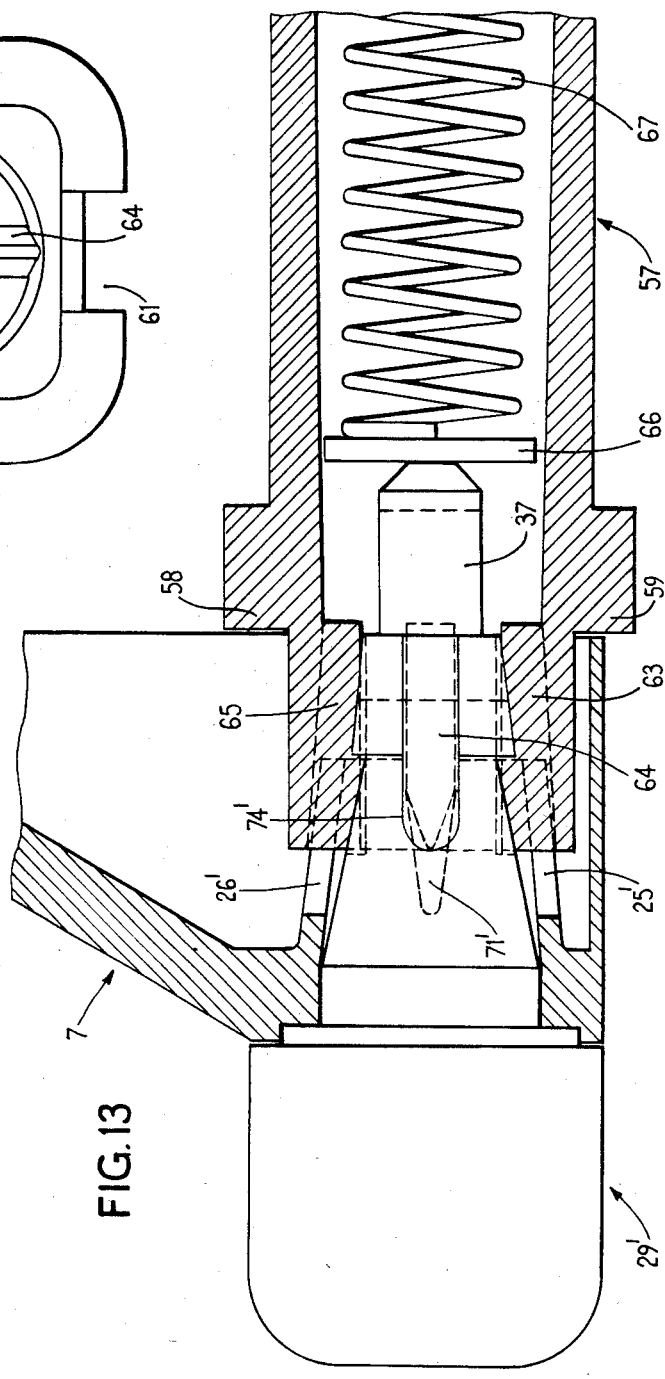
FIG. 13 is a cross-sectional view, at an enlarged scale, of part of the unlocking tool 56 of FIGS. 11, 12 cooperating with a locking pin 29 of FIGS. 6 to 8 fixed in a stiffener member 7 of FIGS. 2 to 4, the locking pin being not shown in cross-section.

The unlocking tool 56 shown in FIGS. 11 and 13 includes a moulded hollow square tubular body 57 provided with an outer collar comprising two parts 58 and 59 separated by longitudinal positioning channels 60 and 61 the width of which is substantially equal to W. At its inner side and near one of its ends tube 57 is provided with four longitudinally extending lip spreading fingers 62 to 65 which taper at their one ends towards the tube opening. A supporting plate 66 slidably mounted in the tube 57 is continuously urged in contact with the other ends of the fingers 62–65 by the pressure exerted on this plate 66 by a helical spring 67 abutting against a moulded stop 68 closing the other end of the tube 57.

To unlock a locking pin such as 29' from a stiffener member 7 wherein it is locked, first the locking pin is brought in the lock or unlock position, i.e. in a position wherein each of the small guidance channels 73 to 76 is in line with one of the slots 69 to 72. Afterwards the unlocking tool 56 is engaged around the stem of this locking pin and then moved axially in such a way that the studs 21, 22 of the stiffener member 7 engage in the positioning channels 60, 61 of the tool 56. During this axial movement the spreading fingers 62–65 engage successively in the small guidance channels 73–76 of the pin 29 and in the slots 69–72 of the frusto-conical locking sleeve 23–26 and thus spread apart the resilient lips 23–26 which finally reach the position shown in FIG. 13. Also supporting plate 66 is displaced in the direction of stop 68 so that spring 67 is compressed. At the moment collar 58, 59 substantially abuts against the adjacent face of stiffener member 7 the locking pin 29 is completely unlocked and positively ejected by releasing spring 67.

While the principles of the invention have been described above in connection with specific apparatus, it is to be clearly understood that this description is made only by way of example and not as a limitation on the scope of the invention.

We claim:

1. A mechanical locking device including a rotatable stem-shaped locking member for latching together a first part having a locking opening therein and a second part, by cooperation of said locking member with said opening during a rotation of said locking member, wherein said locking member is shaped so as to be able to be pushed axially through a resilient locking hole in said second part and so as to be thereafter unable to move axially either in a forward or rearward direction, wherein said first part is a rack for mounting electrical equipment and provided with said opening and with guiding means and that said second part comprises a printed circuit board with parallel edges slidably mounted in said guiding means and a supporting element and is provided with said locking hole, said supporting element carrying said locking member, and wherein said resilient hole in said supporting element is delimited by an annular recess prolonged by a resilient split frusto-conical sleeve comprising a plurality of resilient lips and that said locking member has a first collar fitting in said annular recess and a frusto-conical second collar, said split sleeve and said second collar being so shaped that when said locking member is inserted into said hole until said first collar is engaged in said annular recess, said second collar spreads out said resilient lips of said split sleeve until these lips snap behind said second collar.

2. A mechanical locking device according to claim 1, wherein said locking member further has a frusto-conical body fitting in said frusto-conical sleeve when said first collar is located in said annular recess.

3. A mechanical locking device according to claim 2, wherein said locking member is provided, between said first collar and said frusto-conical body, with a cylindrical portion carrying an indexing finger fitting in a second annular recess of said hole, said second annular recess being located between said first mentioned annular recess and said sleeve and extending over a predetermined angle to limit the rotation of said locking member.

4. A mechanical locking device according to claim 1, wherein said locking member has a slotted tail portion which in an angular unlock position of said locking member can be inserted into said locking opening of said rack and which when then turned over a predetermined angle into a lock position is compressed and locked in said locking opening.

5. A mechanical locking device according to claim 4, wherein said supporting element carries first and second indications of the unlocking and locking position and that said locking member has a pointer which indicates said first and second indication when said locking member carried by said supporting element is in said unlock or lock position respectively.

6. A mechanical locking device according to claim 1, wherein said supporting element is provided near each of its extremities with a locking hole and with positioning studs able to be engaged in said locking opening of said rack and serving to correctly position said supporting element with respect to said rack.

* * * * *